(12) United States Patent
Winslow

(10) Patent No.: US 6,198,351 B1
(45) Date of Patent: Mar. 6, 2001

(54) POWER SENSING APPARATUS FOR POWER AMPLIFIERS

(75) Inventor: Thomas Aaron Winslow, Salem, VA (US)

(73) Assignee: Tyco Electronics Logistics AG, Steinach/SG (CH)

(*) Notice: Subject to any disclaimer, the term of this patent is extended or adjusted under 35 U.S.C. 154(b) by 0 days.

(21) Appl. No.: 09/307,913

(22) Filed: May 10, 1999

(51) Int. Cl.[7] .............................. H02H 7/20; H03F 3/04
(52) U.S. Cl. .................... 330/298; 330/207 P; 327/51; 327/81; 257/382
(58) Field of Search .................. 327/51, 81; 330/298, 330/207 P; 257/382, 401

(56) References Cited

U.S. PATENT DOCUMENTS 5,013,935 * 5/1991 Mahabadi ........................ 327/81
5,426,395 * 6/1995 Cygan ............................. 330/298

* cited by examiner

Primary Examiner—Michael B. Shingleton
(74) Attorney, Agent, or Firm—Arthur L. Plevy; Buchanan Ingersoll PC

(57) ABSTRACT

In a power amplifier comprising a plurality of cascaded field effect transistors (FETs), a power sensing circuit for sensing the output power of the power amplifier comprising a FET device operative in a first linear mode and second saturated mode of operation, the FET having source, gate and drain electrodes; and a low value resistor connected between the source electrode and a reference potential for generating a voltage drop between the source and the reference potential such that when the FET operates in the saturation mode, the voltage drop is indicative of the output power of the power amplifier.

20 Claims, 5 Drawing Sheets

POWER SENSING APPARATUS FOR POWER AMPLIFIERS

FIELD OF THE INVENTION

This invention relates generally to power sensing devices, and more particularly to a power sensor circuit comprising a field effect transistor sensor which is coupled to a power amplifier for sensing the output power of the amplifier.

BACKGROUND OF THE INVENTION

Current power sensing devices often take the form of a shunt diode, which is tapped off of an interstage matching network of a power amplifier. An example of a device of this type is provided in FIG. 1. Such a diode rectifies a voltage wave, which is proportional to the output power of the total amplifier. This yields a DC voltage that is a non-linear function of the transmitted output power from the power amplifier. A relationship between the DC voltage output from the diode rectifier, and the output power of the power amplifier may be established using well-known methods. It is also known in the art that the detection of output power of a power amplifier may be accomplished by the use of a forward directional coupler, which is coupled to a diode detector at the output of the amplifier. The diode detector operates to detect and rectify a power wave proportional to the output power of the power amplifier. Such a device is illustrated in FIGS. 2 and 3A–B. A number of problems, however, exist with each of the above devices.

First, the use of an internal diode detector requires that it be by-passed using a large value capacitor, as well as low pass filter, for holding the diode rectified voltage which is a function of the incident power onto the diode detector. Such a circuit requires a relatively large area semiconductor (for example, a large area of gallium arsenide) in order to properly implement such a circuit. Furthermore, the use of an output forward directional coupler to sample and rectify the output power of the power amplifier results in an additional expense associated with the circuit. Moreover, the use of an ouput forward directional coupler also requires a temperature compensated diode detector circuit, resulting in additional cost and complexity to the sensing circuit.

Accordingly, a device which replaces each of the above components and which utilizes a single semiconductor structure that is both small and compact is highly desirable.

SUMMARY OF THE INVENTION

It is an object of the present invention to provide a power amplifier comprising a plurality of cascaded field effect transitors (FETs), a power sensing circuit for sensing the output power of the power amplifier comprising a FET device operative in a first linear mode and second saturated mode of operation, the FET having source, gate and drain electrodes; and a resistor connected between the source electrode and a reference potential for generating a voltage drop between the source and the reference potential such that when the FET operates in the saturation mode, the voltage drop is indicative of the output power of the power amplifier.

It is also an object of the present invention to provide a power sensing circuit for sensing the ouput power of a semiconductor device comprising a plurality of semiconductor FETs which are driven via an input signal from linear to power saturated conditions, wherein a plurality of drain finger electrodes, source finger electrodes, and gate finger electrodes define each of the semiconductor FETs and wherein the source finger electrodes are coupled to a reference potential, the power sensing circuit comprising a FET having a source, gate and drain electrode disposed on the semiconductor substrate wherein the source electrode corresponding to the sensing circuit FET is connected to the reference potential via a bond pad and a resistor, such that when the power amplifier enters a saturated condition, the power sensing circuit FET enters saturation and a voltage drop is generated across the resistor indicative of the level of saturation of the power sensing circuit FET and which corresponds to the output power of the amplifier.

It is a further object of the present invention to provide a method for providing a power sensing apparatus for a power amplifier comprising the steps of forming an active region at a surface of a semiconductor substrate forming a plurality of drain finger electrodes, source finger electrodes, and gate finger electrodes within the active region; forming a source bus for connecting each of the source finger electrodes and coupling the source fingers to a reference potential; and removing one of the FET source finger connections and inserting a resistor between the source finger electrode and the reference potential, wherein when the power amplifier enters compression mode the FET having the source finger coupled to the resistor operates to generate a voltage across the resistor representative of the output power of the amplifier.

DETAILED DESCRIPTION OF THE INVENTION

Figure 1:
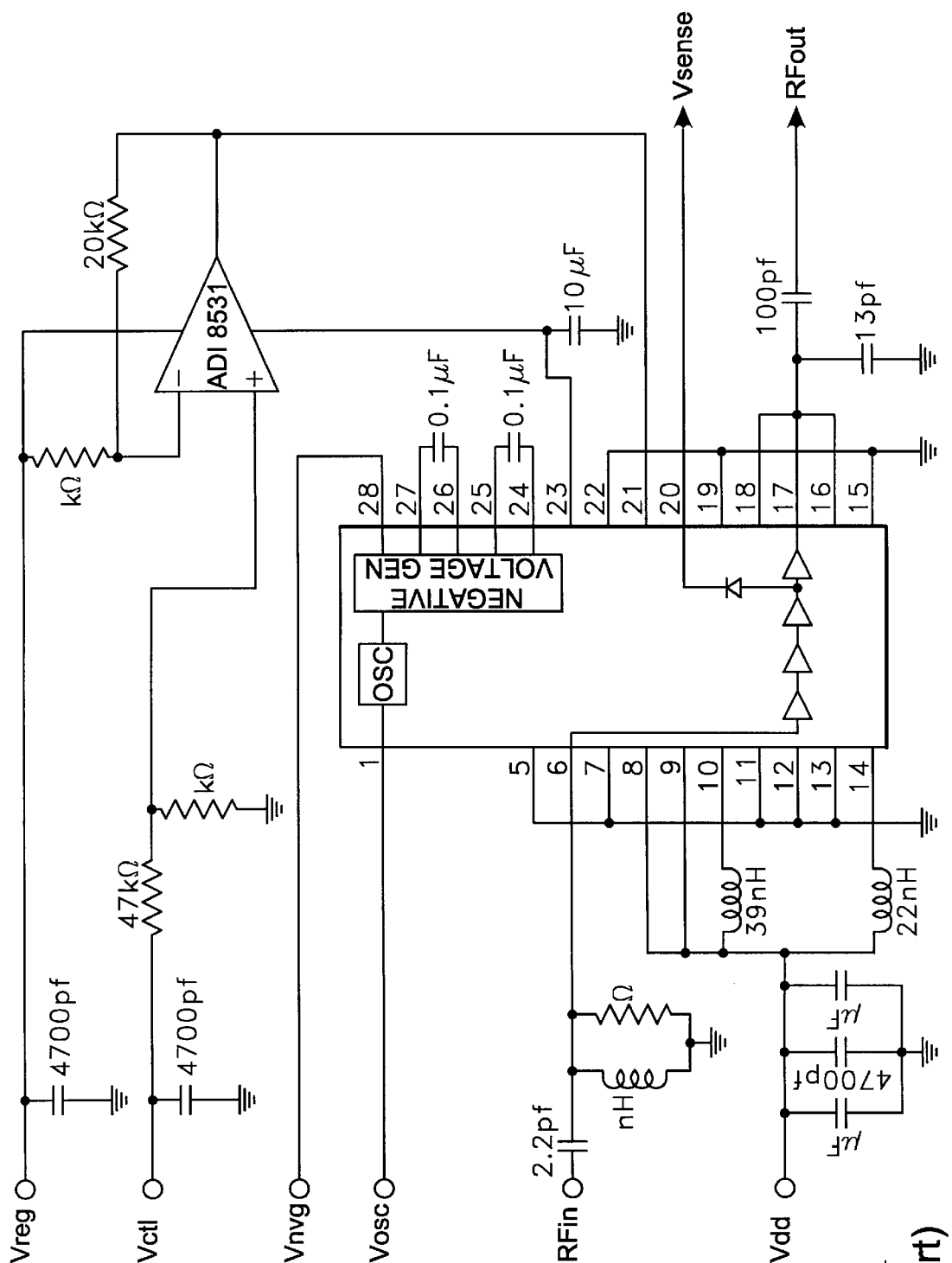
FIG. 1 is a schematic representation of a prior art sensing device tapped off of an interstage network for a power amplifier.
Figure 2:
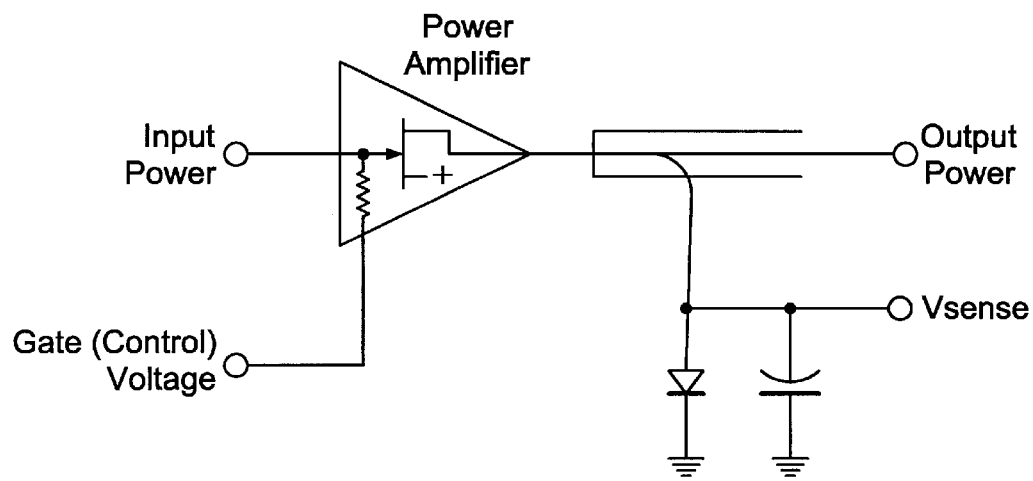
FIG. 2 illustrates an alternate prior art implementation for generating a power sense signal using an output coupler and a diode rectifier.
Figure 3A:
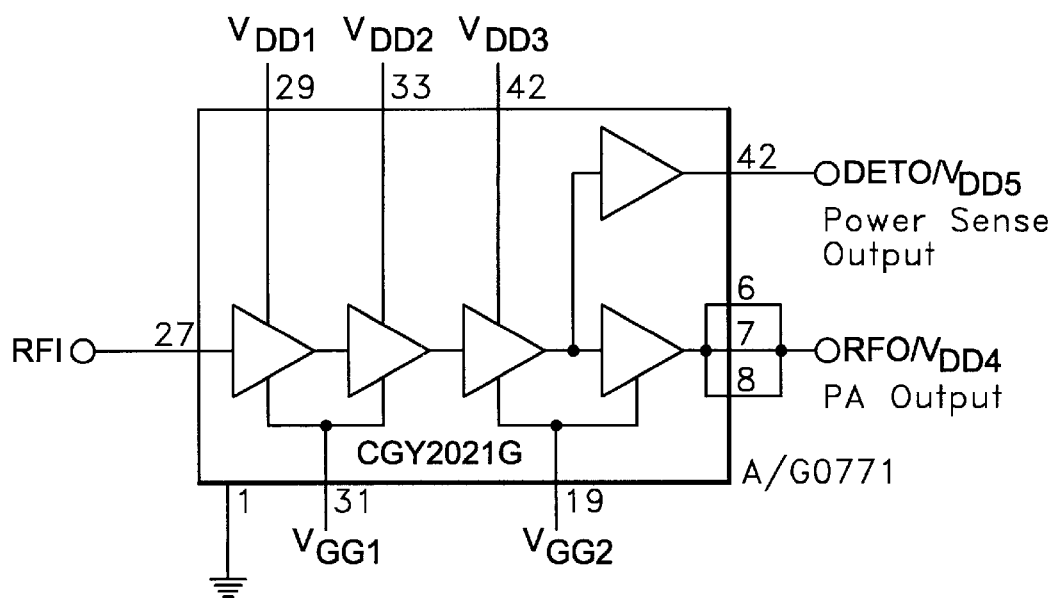
FIGS. 3A–B illustrate a block diagram and board schematic, respectively of a prior art power amplifier having a power sensor driver using a mini amplifier and an off chip rectifier and bias circuit.
Figure 3B:
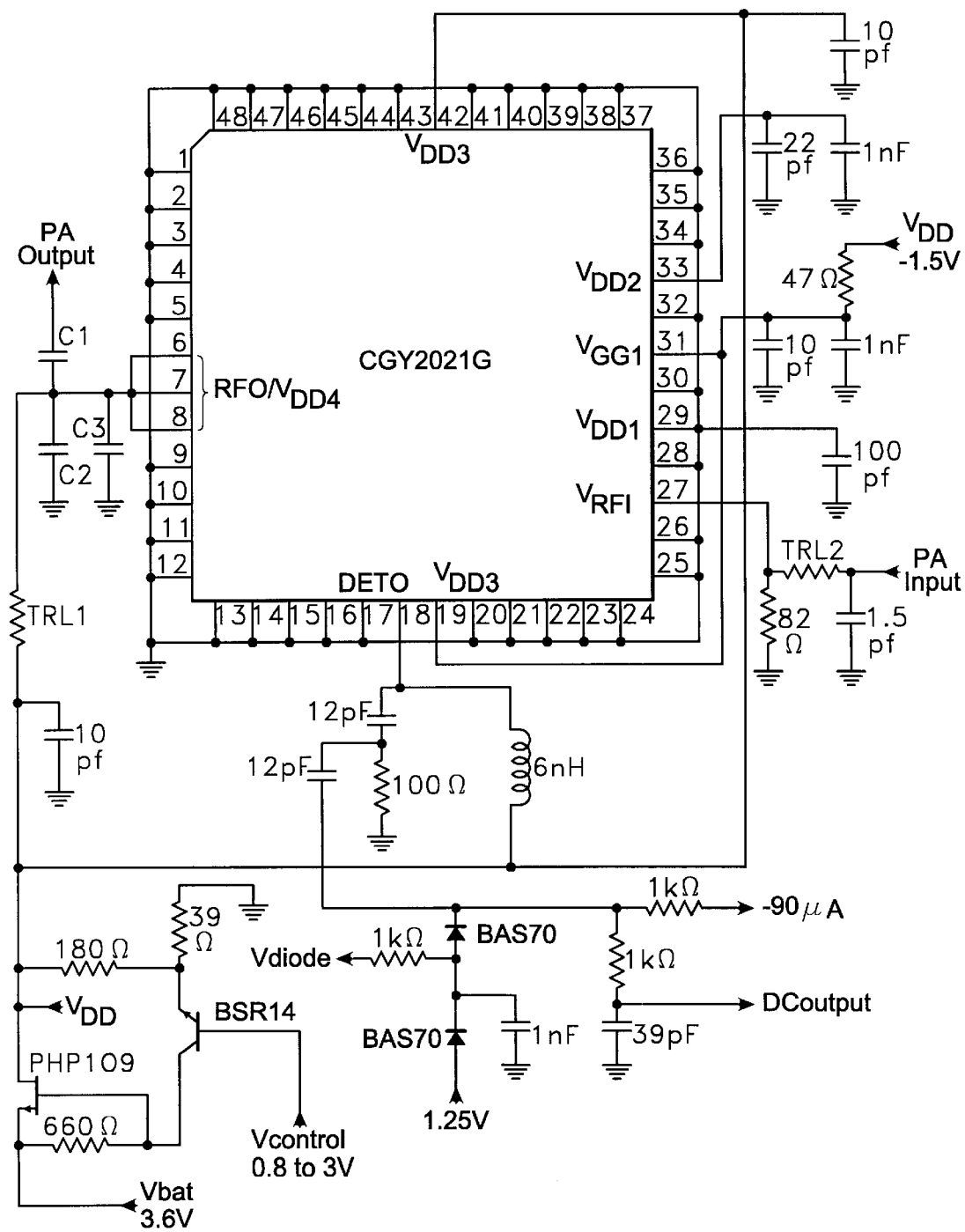
Figure 4:
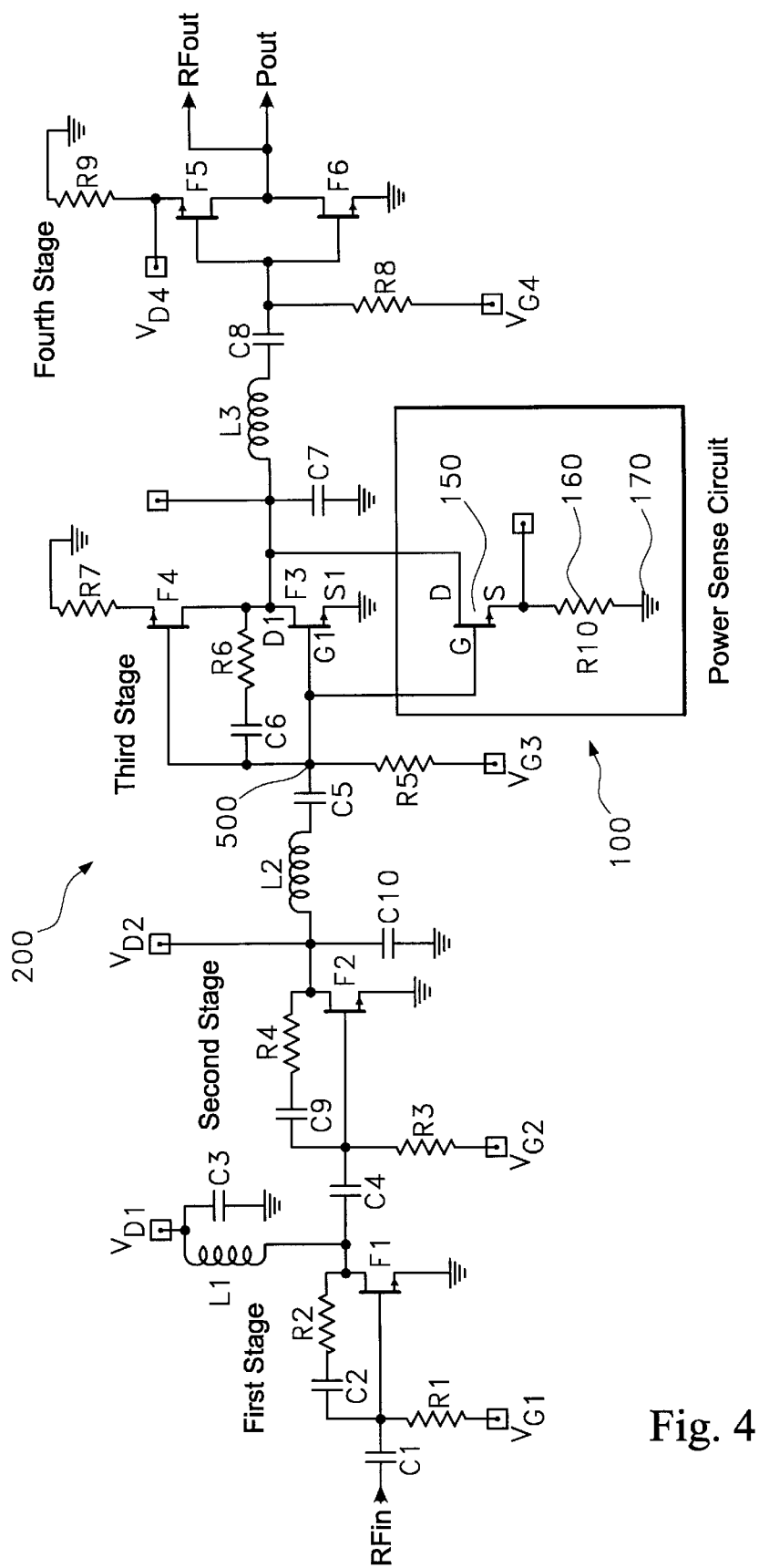
FIG. 4 is a schematic representation of a power sensing circuit coupled to a power amplifier according to the present invention.
Figure 5:
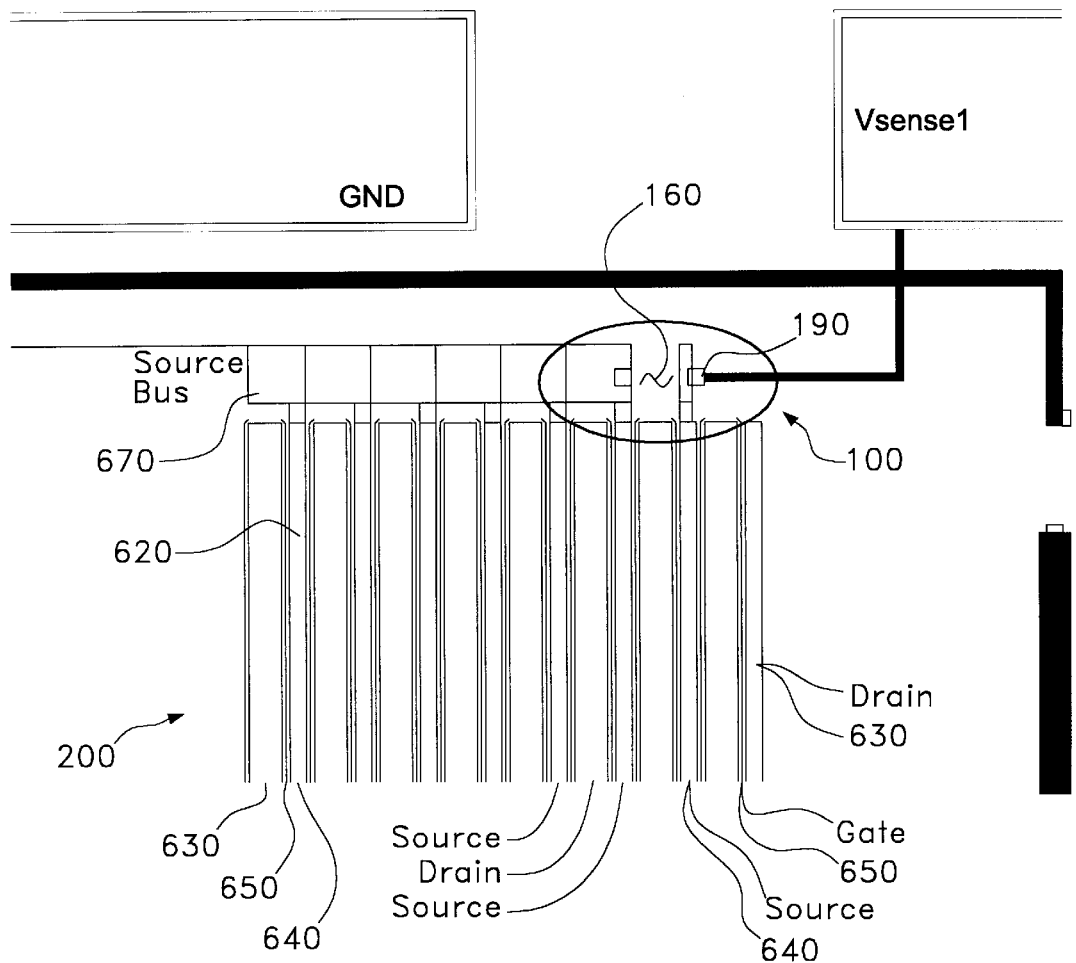
FIG. 5 illustrates a plan view of a semiconductor circuit schematic representation of the FET sensor circuit topology according to the present invention.

Referring now to FIG. 4, there is shown a power sensing circuit 100 coupled to a multistage power amplifier 200 according to the present invention. The power sensing circuit 100 comprises a FET device 150 having gate, source, and drain electrodes (G,S,D), wherein a resistor 160 (R10) is coupled between the source electrode and ground or reference potential 170. In typical circuits, the source connection of the FET fingers is normally connected directly to ground through a backside via hole or wire bond. However, as depicted in FIGS. 4 and 5, and in accordance with the present invention, the source connection of one of the FET fingers is broken out, and resistor 160 is inserted in series with its connection to ground. The voltage that is generated across the resistor 160 as the FET 150 enters compression represents a measure of the level of compression of the FET. This is also related to the output power of the multistage amplifier 200. The voltage $V_S$ across the resistor 160 increases as the FET 150 is driven further into compression.

Therefore, under fixed loading conditions, the DC voltage level $V_s$ across the sensing resistor 160 strongly correlates with the output power of the amplifier device.

As shown in FIG. 4, the multistage amplifier 200 comprises a first, second, third and fourth stage amplifier circuitry comprising conventional field effect transistor devices F1 through F6 in cascaded fashion and configured to achieve power amplification. The values associated with each of the components are provided as exemplary values only and are not intended to be limitive of the invention. The amplifier 200 is preferably a MESFET power amplifier designed for GSM cellular phone applications. First stage FET device F1 is capacitively coupled to second stage FET F2 via capacitor C4, while the second the third amplification stages are coupled together via inductor L2 and capacitor C5 at node 500. The third stage FET amplifier F3 has a gate electrode G1 which is coupled to the gate electrode of power sense circuit FET 150 of sensing circuit 100. Thus, the input signal to the third stage amplification FET F3 is provided to sensing circuit 100. A drain electrode D1 of third stage FET F3 is similarly coupled to the drain electrode D of sensor circuit FET 150. Resistor 160 is coupled between the source electrode S of FET 150 and ground potential. When the semiconductor power amplifier 200 is driven via RF input signal $RF_{in}$ from a linear to a power saturated condition, the power sensing circuit 100 coupled to the power amplifier 200 senses the corresponding change at its gate electrode and also enters saturation in response thereto. A voltage drop is then generated across the resistor 160 indicative of the level of saturation of the power sensing circuit FET 150. This value corresponds to the output power Pout of the amplifier 200.

As shown in FIG. 5, a bond pad 190 on the semiconductor amplification device 200 is coupled to the resistor and operates to provide an output connection for measuring the voltage drop across resistor 160. In the preferred embodiment, the power amplifier comprises a series of gallium arsenide based FETs, including the power sensing FET device. Typically, the resistor 160 is a small valued resistor of approximately 30 ohms for sensing the voltage drop indicative of the power associated with the amplifier.

With reference made to FIG. 5, formation of power sensing circuit 100 for power amplifier 200 comprises the steps of forming an active region 620 on a semiconductor substrate surface and forming a plurality of drain finger electrodes 630, source finger electrodes 640 and gate finger electrodes 650 in interband fashion within the active region. Source bus 670 connects each of the source finger electrodes together for coupling to a ground potential of zero volts. One of the FET source finger connections is then eliminated or removed from the source bus using conventional techniques (e.g. . . . ) and a resistive device 160 is inserted between the source finger electrode and the reference potential. Bond pad 190 is provided to enable measurement of the voltage drop across resistor 160 ($V_{sense}$). In this manner, when the power amplifier circuit 200 enters the compression mode (i.e. saturation mode), the corresponding FET 150 whose source finger is coupled to the resistor 160 also operates in the compression mode. The resistor 160 associated with the sensor circuit FET 150 operates to generate a voltage $V_s$ representative of the measure of output of the amplifier. Advantageously, the power amplifier and sensor circuit may be implemented on a single GaAs MMIC chip, thus providing an extremely small and compact device.

The invention having been described, it is clear that certain modifications and variations of the power sensing apparatus can be made without departing from the spirit and scope of the invention. These modifications may include the application of various FET devices and related components, power requirements, and the like, to the extent that they are still able to perform as described. These obvious modifications and variations are within the theme and spirit of the invention and are considered within the scope of the following claims.

What is claimed is:

1. A power sensing circuit for sensing the output power of a power amplifier comprising:

a FET device operative in a first linear mode and second saturated mode of operation, said FET having source, gate and drain electrodes; and resistive means connected between said source electrode and a reference potential for generating a voltage drop between said source and said reference potential such that when said FET operates in said saturation mode, said voltage drop is indicative of the output power of said power amplifier.

2. The circuit according to claim 1, wherein said reference potential is zero volts.

3. The circuit according to claim 1, wherein said power amplifier and said power sensing circuit are formed on a single MMIC chip.

4. The circuit according to claim 1, wherein in said saturation mode the voltage drop between said source and said reference potential is proportional to the level of saturation of said FET.

5. The circuit according to claim 1, wherein said voltage drop increases as said power sensing circuit FET is driven into saturation.

6. The circuit according to claim 1, wherein said resistance means comprises a low value resistor.

7. The circuit according to claim 1, wherein said power amplifier is a staged amplifier comprising a plurality of cascaded FETs, and wherein said power sensor FET gate electrode is coupled to a gate electrode of one of said plurality of FETs.

8. The circuit according to claim 7, wherein said drain electrode is coupled to the drain electrode of said one of said plurality of FETs.

9. A power sensing circuit for sensing the output power of a semiconductor device which is driven via an input signal from a linear to a power saturated condition, wherein a plurality of drain finger electrodes, source finger electrodes, and gate finger electrodes are disposed on a semiconductor substrate to form said semiconductor device, and wherein said source finger electrodes are coupled to a reference potential, said power sensing circuit comprising a field effect transistor (FET) having source, gate and drain finger electrodes disposed on said semiconductor substrate, wherein said source electrode corresponding to said power sensing circuit FET is connected to said reference potential via a bond pad and a resistor, such that when said semiconductor device enters a saturated condition, said power sensing circuit FET enters saturation and a voltage drop is generated across said resistor indicative of the level of saturation of said power sensing circuit FET and which corresponds to the output power of said amplifier.

10. The circuit according to claim 9, wherein a bond pad on said semiconductor device is coupled to said resistor and operates to provide an output connection for measuring the voltage drop across said resistor.

11. The circuit according to claim 9, wherein said semiconductor device comprises gallium arsenide based FETs.

12. The circuit according to claim 9, wherein said resistor is a small valued resistor or approximately 30 ohms.

13. The circuit according to claim 9, wherein said saturation condition comprises a compression state of said power sensing circuit FET.

14. The circuit according to claim 9, wherein the voltage drop generated across said resistor increases as said semiconductor device and said power sensing circuit FET is driven into saturation.

15. A method for providing a power sensing apparatus for a power amplifier operable in a compression mode comprising the steps of:

forming an active region at a surface of a semiconductor substrate;

forming a plurality of drain finger electrodes, source finger electrodes, and gate finger electrodes within said active region;

forming a source bus for connecting each of said source finger electrodes and coupling said source fingers to a reference potential; and removing one of said FET source finger connections to said source bus and inserting a resistor between said one source finger electrode and said reference potential, wherein when said power amplifier enters compression the FET having said source finger coupled to said resistor also operates in compression mode, such that the voltage generated across said resistor represents a measure of the output power of said amplifier.

16. The method according to claim 15, wherein said voltage generated across said resistor as said FET enters compression is indicative of the level of compression of said FET.

17. The method according to claim 15, wherein driving said FET further into compression operates to increase the voltage drop across said resistor.

18. The method according to claim 15, wherein the voltage drop across resistor is a DC voltage drop under fixed loading conditions.

19. The method according to claim 15, wherein said semiconductor device is gallium arsenide based.

20. The method according to claim 15, wherein said reference potential is ground potential.

* * * * *